US006537878B1

United States Patent
Liaw et al.

(10) Patent No.: US 6,537,878 B1
(45) Date of Patent: Mar. 25, 2003

(54) FABRICATION METHOD OF STATIC RANDOM ACCESS MEMORY CELL

(75) Inventors: Shiou-han Liaw, Hsinchu (TW); Hong-ming Yang, Hsinchu (TW)

(73) Assignee: Brilliance Semiconductor, Inc. (TW)

( * ) Notice: Subject to any disclaimer, the term of this patent is extended or adjusted under 35 U.S.C. 154(b) by 0 days.

(21) Appl. No.: 10/137,546

(22) Filed: May 1, 2002

(30) Foreign Application Priority Data

Jan. 31, 2002 (TW) ........................... 91101724 A

(51) Int. Cl.⁷ ............................................ H01L 21/336
(52) U.S. Cl. ...................... 438/258; 438/241; 438/257
(58) Field of Search .................................. 438/258, 241, 438/257, 692

(56) References Cited

U.S. PATENT DOCUMENTS

| 5,691,217 A | * | 11/1997 | Honeycutt | 437/47 |
| 5,827,764 A | * | 10/1998 | Liaw et al. | 438/238 |
| 5,926,706 A | * | 7/1999 | Liaw et al. | 438/238 |
| 5,989,946 A | * | 11/1999 | Honeycutt | 438/153 |
| 6,049,093 A | * | 4/2000 | Manning et al. | 257/67 |
| 6,217,073 B1 | * | 8/2001 | Roberts | 438/238 |
| 6,319,800 B1 | * | 11/2001 | Manning | 438/542 |
| 6,440,804 B1 | * | 8/2002 | Jen | 438/279 |

* cited by examiner

Primary Examiner—Alexander Ghyka
(74) Attorney, Agent, or Firm—Martine & Penilla, LLP

(57) ABSTRACT

The present invention relates to a method for forming a static random access memory (SRAM) cell. In order to avoid constantly reducing operating voltage of the SRAM cell affecting the unit stability and noise jamming of the SRAM cell during read/write processes, the invention employs different thicknesses of gate oxide layers of an access transistor and a pull down transistor. Thereby, not only the β ratio is increased, but also the unit area is decreased.

9 Claims, 3 Drawing Sheets

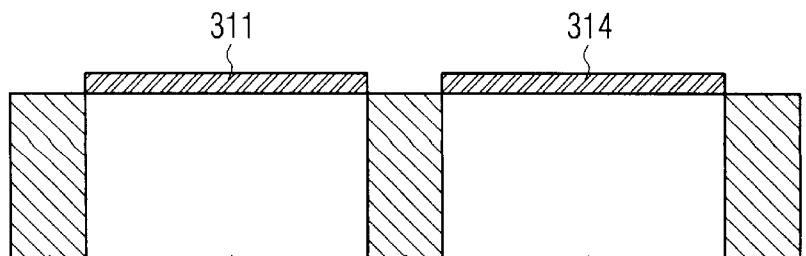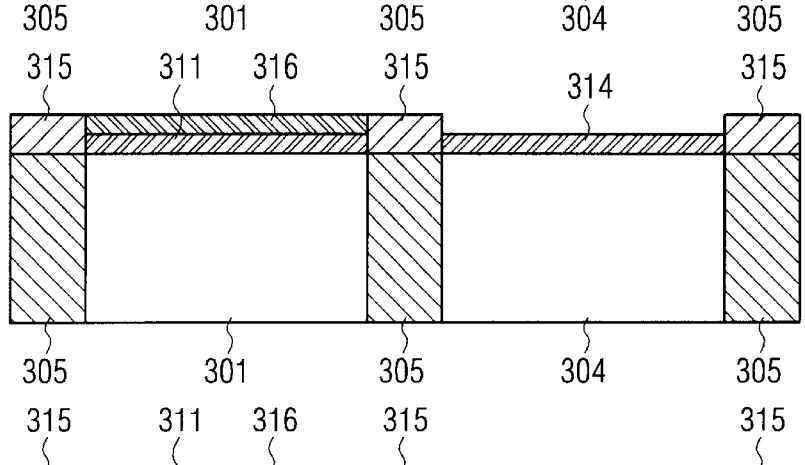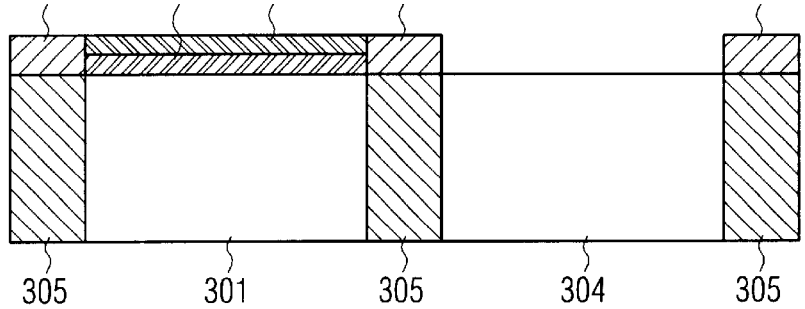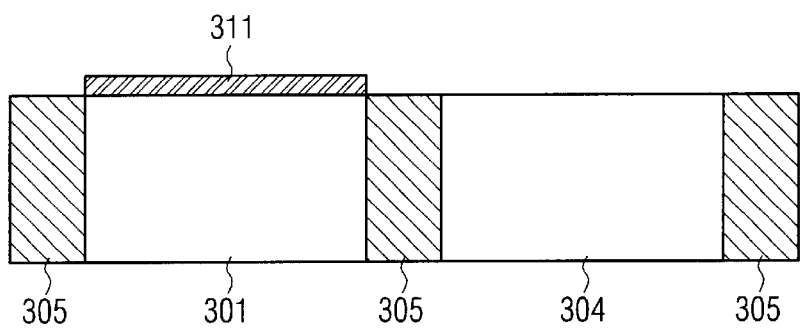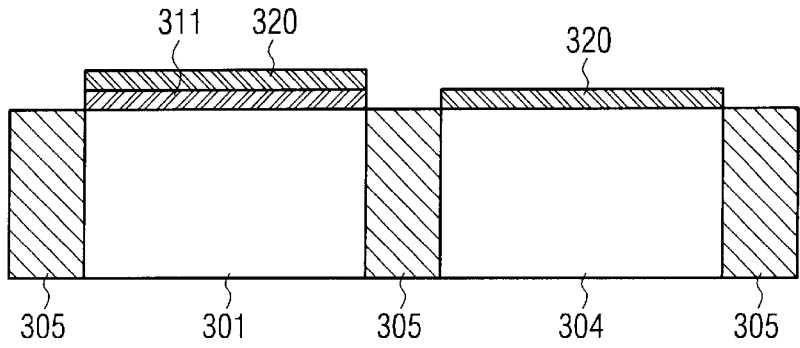

FABRICATION METHOD OF STATIC RANDOM ACCESS MEMORY CELL

BACKGROUND OF THE INVENTION

1. Field of the Invention

The invention relates to a method for forming a static random access memory (SRAM) cell, wherein the β ratio of the field effect transistors (FETs) of the cell stays at a substantially constant value, so as to reduce noise jamming during the read/write process of the SRAM cell, that is, to increase the operation stability of the SRAM cell by using various thicknesses of gate oxide layers of the access transistor and pull down transistor.

2. Description of the Related Art

The conventional fabrication method of an SRAM cell employs a plurality of transistors to compose access transistors and pull down transistors. The access transistors are connected with a word line and a bit line to control the read/write operation. The conductivity status of this kind of transistors affects the operation stability of the SRAM cell namely affecting the value of β ratio. With respect to the equivalent direct current analysis of transistors, the conductivity status of transistors regards the conductivity parameter P as an indicator. The equation for the calculation of P is as follows:

$$P = I/(V_g - V_t)^2 = 1/2(W/L)\mu C_{ox} \quad \text{equation (1)}$$

$$C_{ox} = \in / t_{ox} \quad \text{equation (2)}$$

Wherein I is the equivalent direct current of the transistor, $V_g$ is the gate voltage, $V_t$ is the threshold voltage, W is the channel width, L is the channel length, $\mu$ is the electron mobility, $C_{ox}$ is the oxide layer capacitance per unit area, $\in$ is the dielectric constant of the oxide layer, and $t_{ox}$ is the thickness of the oxide layer.

Furthermore, the equivalent direct current β ratio of the pull down transistor and access transistor, also called the current gain, is represented by the equation below:

$$\beta I_{pd}/I_{access} \quad \text{equation (3)}$$

Also, the equation of the equivalent direct current of the transistor derived from equation (1) is as the following:

$$I = 1/2(W/L)\mu C_{ox}(V_g - V_t)^2 \quad \text{equation (4)}$$

Therefore the equivalent direct currents of the pull down transistor and the access transistor $I_{pd}$ and $I_{access}$, are respectively replaced by the equation (4) and substituted into the equation (3), obtaining β as in the equation (5) below:

$$\beta = I_{pd}/I_{access} = [(W_{pd}/L_{pd})C_{pd}(V_g-V_t)^2]/[W_{acces}/L_{access}]C_{access}(V_g-V_t)^2] \quad \text{equation (5)}$$

When the pull down transistor and access transistor have the same channel width ($L_{pd}=L_{access}$) and oxide layer thickness ($C_{pd}=C_{access}$), the equation (5) can simplify β as the ratio of the channel widths of the pull down transistor and access transistor, represented by the equation (6) below:

$$\beta W_{pd}/W_{access} \quad \text{equation (6)}$$

FIG. 1 is the side view of a conventional SRAM cell, wherein the pull down transistor 104 and the access transistor 101 have the same oxide layer thickness and the same channel width, and then in accordance with the equation (6) above, β is equal to the ratio of the channel width of the pull down transistor, and the channel width of the access transistor.

Referring to the circuit diagram shown in FIG. 2, there are two methods to change the channel widths of the transistors so as to raise β. Method one is to increase the channel width of the pull down transistor ($Q_1$ and $Q_2$) to raise β, however the method enlarges the total area of the SRAM cell at the same time, thereby increasing the production cost. Method two is to decrease the channel width of the access transistor ($Q_5$ and $Q_6$) to raise β, although the method reduces the total area of the SRAM cell, nevertheless, the current of the access transistor is decreased causing the operation speed of the SRAM cell to slow down.

SUMMARY OF THE INVENTION

Accordingly, an object of the invention is to provide a method for forming an SRAM cell capable of adjusting the ratio (β ratio) of equivalent direct current of the pull down transistor and access transistor as an advantage.

Another object of the invention is to provide a method for forming an SRAM cell, in which the pull down transistor and access transistor have gate oxide layers of different thicknesses.

Another object of the invention is to provide a fabrication method of SRAM cells capable of adjusting the current gain of the pull down transistor and access transistor as an advantage.

Still another object of the invention is to provide a method for forming an SRAM cell, which can save the area of the SRAM cell, thereby making β conform to the desired value.

The present invention is a method for forming an SRAM cell having an access transistor and a pull down transistor isolated by an isolation layer. The method includes the steps of: forming a first gate oxide layer on the access transistor and the pull down transistor; coating a photoresist onto the isolation layer and the first gate oxide layer on the access transistor; removing the first gate oxide layer on the pull down transistor by wet etching; removing the photoresist on the isolation layer and the photoresist on the first gate oxide layer on the access transistor; forming a second gate oxide layer on the first gate oxide layer and the pull down transistor; forming an electrode on the second gate oxide layer; and connecting the electrode to a word line, a bit line, and an inversion bit line by wiring technique.

The objects, characteristics and advantages of the invention, are to be more conspicuous after referring to the descriptions and accompanying drawings.

BRIEF DESCRIPTION OF THE DRAWINGS

FIGS. 3A to 3E show the method for forming an SRAM cell in accordance with a first embodiment of the invention.

DESCRIPTION OF THE PREFERRED EMBODIMENTS

First Embodiment

Figure 1:
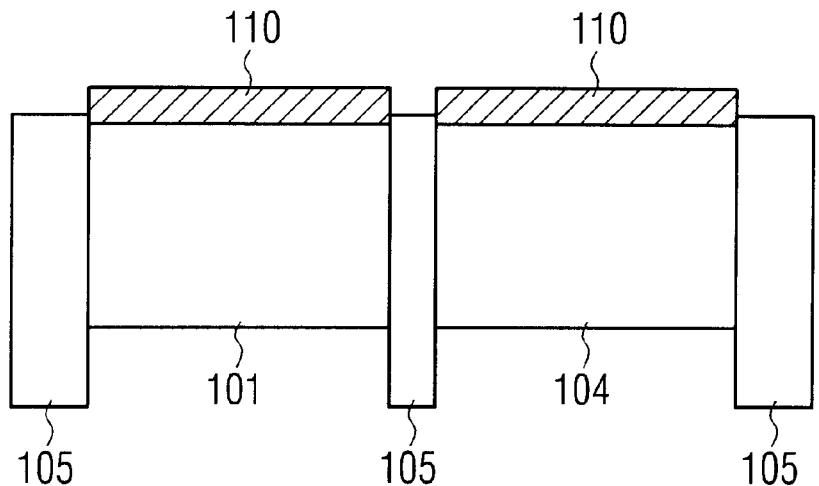
FIG. 1 is the side view showing a conventional SRAM cell.
Figure 2:
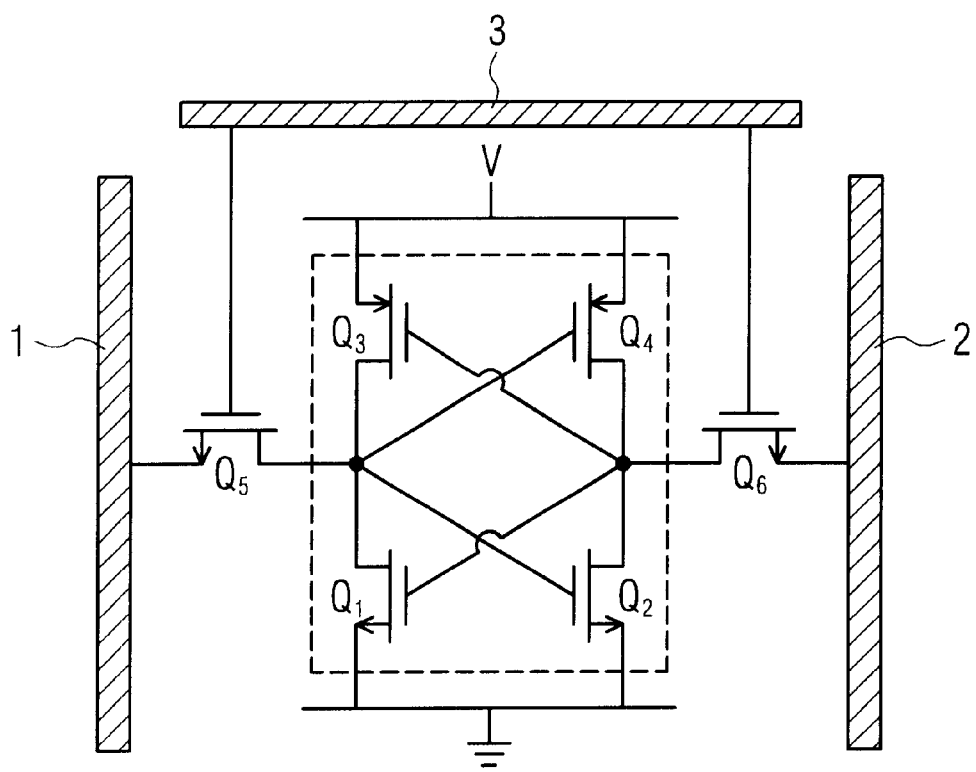
FIG. 2 is the circuit diagram of the convention SRAM cell.

In accordance with the SRAM cell fabricated by the first embodiment of the present invention, two FETs $Q_1$ and $Q_2$ of the pull down transistor, and two FETs $Q_5$ and $Q_6$ of the access transistor have the same channel width L. The fabrication method of the SRAM cell includes the oxidation process shown in FIGS. 3A to 3E. First, referring to FIG. 3A, a first gate oxide layer 311 is grown on an access transistor 301, and a first gate oxide layer 314 is grown the on a pull down transistor 304, respectively. Then, referring to FIG. 3B, a photoresist 315 is coated onto an isolation layer 305 and a photoresist 316 onto the first gate oxide layer 311 of the access transistor 301. Next, referring to FIG. 3C, the first gate oxide layer 314 of the pull down transistor 314 is removed by wet etching. Referring to FIG. 3D, the photoresist 315 on the isolation layer 305 and the photoresist 316 on the first gate oxide layer 311 of the pull down transistor 306 are removed. Then, referring to FIG. 3E, a second gate oxide layer 320 is simultaneously grown on the first gate oxide layer 311 and the pull down transistor 304. Finally, an electrode is formed on the second gate oxide layer 320, and is connected to a bit line 1, a inversion bit line 2, and a word line 3 by wiring technique.

In the method for forming the SRAM cell of the embodiment, the gate oxide layer thicknesses of the pull down transistor and access transistor are made different by the oxidation fabrication process thereof. Referring to the aforementioned equation (2), the larger the gate oxide layer thickness gets, the smaller the gate oxide layer capacitance $C_{ox}$ per unit area becomes. Due to the requirement of β=2 (that is, $I_{pd}/I_{access}$=2), the stability during data access is ensured so as to avoid disorder caused by jamming on the circuit (refer to "The Impact of Intrinsic Device Fluctuations on CMOS SRAM Cell Stability", IEEE Journal of Solid-State Circuits Vol. 36. No. 4 April 2001). Therefore, the gate oxide layers are separately grown twice in the embodiment. For the first time, the first gate oxide layer 311 with 15 Å to 30 Å in thickness is grown on the access transistor 301, and then the second gate oxide layer 320 with 15 Å to 30 Å in thickness is grown on the first gate oxide layer 311 and the pull down transistor 304. In other words, the first gate oxide layer 311 grown on the access transistor 301 plus the second gate oxide layer 320 are thicker than the second gate oxide layer 320 grown on the pull down transistor 304. From the equation (2) and the equation (5) above, it is proven that the β ratio is directly proportional to the gate oxide layer ratio of the pull down transistor and the access transistor. Hence, by growing gate oxide layers of different thicknesses on the pull down transistor and access transistor, the embodiment is capable of adjusting the ratio of equivalent direct current (the β ratio) of the pull down transistor and access transistor as an advantage. Thereby, the current gain of the pull down transistor and the access transistor is increased.

Second Embodiment

Figure 4:
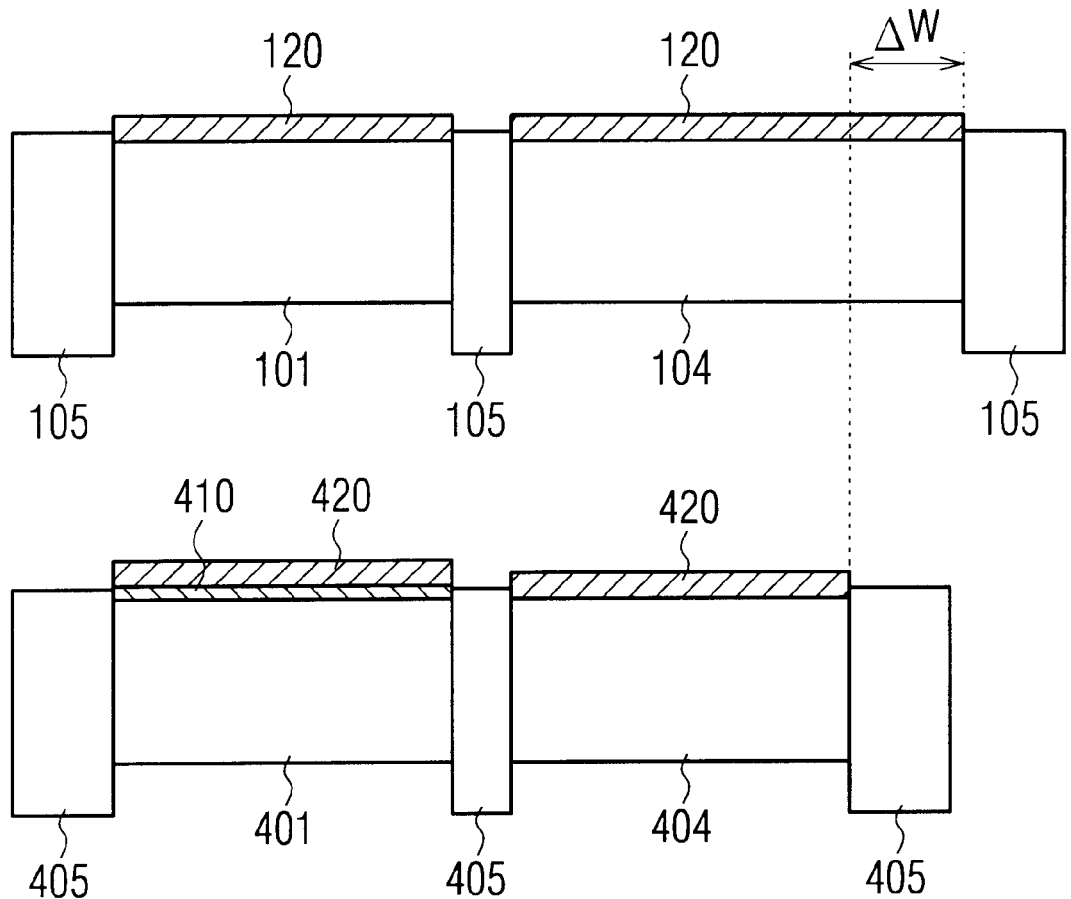
FIG. 4 shows side views of a conventional SRAM cell and the SRAM cell in accordance with a second embodiment of the invention.

FIG. 4 shows a comparison of side views of SRAM cells from the prior technique and the embodiment, and the latter efficiently saves the area of the pull down transistor. For the reason that the area of a single electronic unit is determined by the channel length L and the channel width W, and therefore reducing the channel width by half of its original can reduce the unit area by half as well. Because of the current of the FET (according to equation (4)) is directly proportional to $W/L*C_{ox}*\mu*(V_g-V_t)^2$ and so when a second gate oxide layer 420 on a pull down transistor 404 is reduced to half of the conventional gate oxide layer 120 (substantially 15 Å to 30 521 ), the $C_{ox}$ of the transistor is raised. At this moment, the channel width of the pull down transistor 404 is reduced to half of the channel width of the conventional pull down transistor 104 in order to save the area of the pull down transistor and the gate oxide layer thereof. The embodiment involves the implementation of the following steps on an access transistor 401 and the pull down transistor 404, isolated by an isolation layer 405. First, a first gate oxide layer 410 is grown on the access transistor 401 and the pull down transistor 404. Then, a photoresist is coated onto the isolation layer 405 and the first gate oxide layer 410 on the access transistor 401. Next, the first gate oxide layer 410 of the pull down transistor 404 is removed by wet etching. The photoresist on the isolation layer 405 and the photoresist on the first gate oxide layer 410 on the access transistor 401 are removed. Then, a second gate oxide layer 420 is simultaneously grown on the first gate oxide layer 410 and the pull down transistor 404. An electrode is formed on the second gate oxide layer 420 and is connected to the bit line 1, the inversion bit line 2, and the word line 3 by wiring technique.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for forming a static random access memory (SRAM) cell having an access transistor and a pull down transistor isolated by an isolation layer, the method comprising:

forming a first gate oxide layer on the access transistor and the pull down transistor;

coating a photoresist onto the isolation layer and the first gate oxide layer on the access transistor;

removing the first gate oxide layer on the pull down transistor by wet etching;

removing the photoresist on the isolation layer and the photoresist on the first gate oxide layer on the access transistor;

forming a second gate oxide layer on the first gate oxide layer and the pull down transistor;

forming an electrode on the second gate oxide layer; and connecting the electrode to a word line, a bit line, and an inversion bit line by wiring technique.

2. The method as described in claim 1, wherein the access transistor is consisted of M-unit of transistors having a first channel width, where M is an even number.

3. The method as described in claim 1, wherein the pull down transistor is consisted of N-unit of transistors having a second channel width, where N is an even number.

4. The method as described in claim 1, wherein the M-unit transistors are two field effect transistors (FETs) having the first channel widths.

5. The method as described in claim 1, wherein the N-unit transistors, are four FETs having the second channel widths.

6. The method as described in claim 2 or claim 3, wherein the second channel width is substantially w-fold of the first channel width, where w is a rational number.

7. The method as described in claim 6, wherein the second channel width is substantially half-fold of the first channel width.

8. The method as described in claim 1, wherein the thickness of the second gate oxide layer is substantially t-fold of the thickness of the first gate oxide layer, where t is a rational number.

9. The method as described in claim 1, wherein the first gate oxide layer and second gate oxide layer can be substantially 15 Å to 30 Å in thickness.

* * * * *